United States Patent
Yoon et al.

(10) Patent No.: US 9,557,838 B2
(45) Date of Patent: *Jan. 31, 2017

(54) TOUCH PAD AND ELECTRONIC DEVICE HAVING THE SAME

(71) Applicant: Samsung Electronics Co., Ltd, Suwon-si, Gyeonggi-do (KR)

(72) Inventors: Woon-sang Yoon, Seoul (KR); Do-kyum Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/263,270

(22) Filed: Apr. 28, 2014

(65) Prior Publication Data

US 2014/0233062 A1     Aug. 21, 2014

Related U.S. Application Data

(63) Continuation of application No. 13/720,555, filed on Dec. 19, 2012, now Pat. No. 8,749,509, which is a
(Continued)

(30) Foreign Application Priority Data

Mar. 21, 2007    (KR) ........................ 10-2007-0027708

(51) Int. Cl.
*G06F 3/041*     (2006.01)
*G06F 3/02*      (2006.01)
(Continued)

(52) U.S. Cl.
CPC ............. *G06F 3/041* (2013.01); *G06F 3/0202* (2013.01); *G06F 3/023* (2013.01);
(Continued)

(58) Field of Classification Search
CPC .................. G06F 3/0202; G06F 3/041; H03K 2217/960785; H04N 1/00392; H04N 1/04
(Continued)

(56) References Cited

U.S. PATENT DOCUMENTS 4,306,716 A   12/1981   James et al.
4,554,419 A   11/1985   King et al.
(Continued)

FOREIGN PATENT DOCUMENTS

DE    10259297      11/2003
JP    10-106381     4/1998
(Continued)

OTHER PUBLICATIONS

European Summons to Attend Oral Proceedings issued on Feb. 11, 2011 in EP Application No. 08101488.8.
(Continued)

*Primary Examiner* — Viet Pham
(74) *Attorney, Agent, or Firm* — Staas & Halsey LLP

(57) ABSTRACT

A touch pad with a simple structure to enable an electronic device to be manufactured more slimly and with low manufacturing costs. The touch pad includes a cover having a plurality of function icons a cover frame to support the cover, the cover frame including a plurality of light guide hollows, and a board, which is engaged with the cover frame and includes touch sensors and luminous elements to illuminate the function icons mounted thereon, the touch sensors and luminous elements being respectively mounted at positions on the board corresponding to the plurality of function icons.

26 Claims, 4 Drawing Sheets

Related U.S. Application Data continuation of application No. 11/970,091, filed on Jan. 7, 2008, now Pat. No. 8,378,975.

(51) Int. Cl.
    *G06F 3/023*     (2006.01)
    *H04N 1/04*     (2006.01)
    *H04N 1/00*     (2006.01)

(52) U.S. Cl.
    CPC ........... *H04N 1/00392* (2013.01); *H04N 1/04* (2013.01); *H03K 2217/960785* (2013.01)

(58) Field of Classification Search
    USPC .................................................. 345/156–173
    See application file for complete search history.

(56) References Cited

U.S. PATENT DOCUMENTS

| | | |
|---|---|---|
| 5,153,386 A | 10/1992 | Siefer et al. |
| 5,543,588 A | 8/1996 | Bisset et al. |
| 6,788,295 B1 | 9/2004 | Inkster |
| 7,656,314 B2 * | 2/2010 | Muranaka ........... G06F 3/03547 178/18.03 |
| 2002/0112942 A1 | 8/2002 | Galmiche et al. |
| 2002/0167704 A1 | 11/2002 | Kleinhans et al. |
| 2003/0058225 A1 | 3/2003 | Kusuda et al. |
| 2005/0116818 A1 | 6/2005 | Kennedy et al. |
| 2005/0133351 A1 | 6/2005 | Hein |
| 2005/0134726 A1 | 6/2005 | Parulski et al. |
| 2006/0085946 A1 | 4/2006 | Hattori et al. |
| 2006/0109258 A1 | 5/2006 | Takisawa |
| 2006/0289284 A1 | 12/2006 | Han |
| 2007/0182981 A1 | 8/2007 | Aiso |

FOREIGN PATENT DOCUMENTS

| | | |
|---|---|---|
| JP | 2006-146701 | 6/2006 |
| KR | 10-2006-0102370 | 9/2006 |
| WO | 2005/101663 | 10/2005 |

OTHER PUBLICATIONS

Office Action issued Jul. 29, 2013 in Korean Application 10-2007-0027708.
European Summons to Attend Oral Proceedings issued on Feb. 1, 2011 in EP Application No. 08101488.8.
European Search Report dated Jun. 9, 2008 issued in EP 8101488.
Office Action issued in Korean Application No. 10-2007-0027708 on Jul. 29, 2013.
U.S. Notice of Allowance mailed Sep. 11, 2012 in U.S. Appl. No. 11/970,091.
U.S. Advisory Action mailed May 16, 2012 in U.S. Appl. No. 11/970,091.
U.S. Office Action mailed Jan. 31, 2012 in U.S. Appl. No. 11/970,091.
U.S. Office Action mailed Jul. 18, 2011 in U.S. Appl. No. 11/970,091.
U.S. Office Action mailed Apr. 22, 2011 in U.S. Appl. No. 11/970,091.
U.S. Office Action mailed Nov. 12, 2010 in U.S. Appl. No. 11/970,091.
U.S. Notice of Allowance mailed Jan. 28, 2014 in U.S. Appl. No. 13/720,555.
U.S. Office Action mailed Oct. 11, 2013 in U.S. Appl. No. 13/720,555.
U.S. Office Action mailed Mar. 26, 2013 in U.S. Appl. No. 13/720,555.
U.S. Appl. No. 11/971,091, filed Jan. 7, 2008, Woon-sang Yoon, Samsung Electronics Co., Ltd.
U.S. Appl. No. 13/720,555, filed Dec. 19, 2012, Woon-sang Yoon, Samsung Electronics Co., Ltd.

* cited by examiner

TOUCH PAD AND ELECTRONIC DEVICE HAVING THE SAME

CROSS-REFERENCE TO RELATED APPLICATIONS

This application is a continuation of prior application Ser. No. 13/720,555, filed Dec. 19, 2012, which is a continuation application of prior application Ser. No. 11/970,091, filed Jan. 7, 2008, in the U.S. Patent and Trademark Office, which claims priority under 35 U.S.C. §119 (a) of Korean Patent Application No. 10-2007-0027708, filed on Mar. 21, 2007, in the Korean Intellectual Property Office, the disclosure of which is incorporated herein by reference in its entirety.

BACKGROUND OF THE INVENTION

1. Field of the Invention

The present general inventive concept relates to an input device of an electronic device, such as a printer, a copier, a multi-function machine, a portable terminal, etc. More particularly, the present general inventive concept relates to a touch pad and an electronic device having the touch pad.

2. Description of the Related Art

Input devices of electronic devices, such as printers, copiers, multi-function machines, portable terminals, etc., have rapidly changed from being button-based to being touch-based. Touch pads, as an example of touch-based input devices of electronic devices, allow products to be manufactured more slimly, as well as having a diverse range of simple exteriors. Accordingly, touch pads are being increasingly used in electronic devices.

FIG. 1 is an exemplary view schematically illustrating a conventional touch pad used in a conventional electronic device. In FIG. 1, the conventional touch pad includes a cover 1 and a first board 2, which is placed under the cover 1, and comprises a printed circuit board (PCB) or a flexible printed circuit (FPC). A touch sensor 3 is mounted on the first board 2. A second board 4 is spaced away from the first board 2 at a predetermined distance, and includes a light emitting diode (LED) 5 mounted thereon to illuminate the upper side of the second board 4. Additionally, a LED holder 6 and a diffusion sheet 7 are placed adjacent to the LED 5. The LED holder 6 and diffusion sheet 7 are used to diffuse light emitted from the LED 5.

In the conventional touch pad, as constructed above, light emitted from the LED 5 is diffused to the first board 2 and illuminates the first board 2, and accordingly function selection icons may be displayed so that a user may recognize the icons and touch an icon indicating a desired function in order to select the desired function.

However, the conventional touch pad as constructed above requires the first board 2 including the touch sensor 3 mounted thereon, and the second board 4 including the LED 5 mounted thereon, so the structure is complicated. Additionally, since the LED holder 6 and diffusion sheet 7, which are required to diffuse light, are placed between the first and second boards 2 and 4, it is difficult to manufacture the touch pad with a slim design, and manufacturing costs may increase.

SUMMARY OF THE INVENTION

The present general inventive concept provides a touch pad with a simplified structure and reduced manufacturing costs by mounting components on a single board and forming an LED integrally with a cover frame.

The present general inventive concept also provides an electronic device which is made slimmer and has an improved external design by including the above-described touch pad.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a touch pad including a cover including a plurality of function icons, a cover frame to support the cover, the cover frame including a plurality of light guide hollows, and a board, which is engaged with the cover frame and includes touch sensors and luminous elements to illuminate the function icons mounted thereon. The touch sensors and luminous elements may be respectively mounted at positions on the board corresponding to the plurality of function icons.

The cover may include a transparent polycarbonate sheet or an acryl sheet.

The cover may include a transparent polycarbonate sheet, a function icon film which is printed on a rear surface of the polycarbonate sheet, and a diffusion silk film, which is printed on the function icon film, to diffuse light emitted from the luminous elements.

The light guide hollows may have a funnel shape in which a diameter of each of the light guide hollows increases from a bottom portion of the light guide hollows to a top portion of each of the light guide hollows.

The touch pad may further include a double-sided adhesive tape to form a secure connection between the cover frame and the board and to prevent air from entering between the cover frame and the board.

A transparent double-sided adhesive tape may be used, or a semi-transparent (or faintly visible) double-sided adhesive tape including a plurality of holes formed at positions corresponding to the respective light guide hollows of the cover frame may be used.

Each luminous element may include a light emitting diode (LED).

The foregoing and/or other aspects and utilities of the present general inventive concept may also be achieved by providing an electronic device including a main body, and an input device which is placed on one side of an upper surface or a side surface of the main body. The input device may include a touch pad as described above.

The main body may include a first body and a second body which is pivotably mounted on the first body, and which is capable of being opened and closed about the first body.

The foregoing and/or other aspects and utilities of the present general inventive concept may also be achieved by providing an image forming apparatus included in an electronic apparatus, the image forming apparatus including a first body housing a feeding unit, a developing unit and a fixing unit, a second body, which is pivotably mounted on the first body, and which is capable of being opened and closed about the first body, the second body including an exposure unit and a scanning unit, a cover unit, which is mounted on the second body to cover the scanning unit, and a touch pad as described above as an input device which is placed on one side of an upper surface of the second body.

The foregoing and/or other aspects and utilities of the present general inventive concept may also be achieved by providing a touch pad, including a cover including a plurality of icons, and a circuit board to connect to the cover, the circuit board including a plurality of touch sensors corresponding to the plurality of icons, and a plurality of luminous elements to illuminate the icons.

The touch pad may further include a cover frame mounted between the cover and the circuit board, the cover frame including a plurality of light guide hollows corresponding to the plurality of luminous elements.

The cover frame may be securely fastened to the circuit board to prevent air bubbles from forming between the cover frame and the circuit board.

The cover may include a diffusion silk film to diffuse light emitted from the plurality of luminous elements.

The foregoing and/or other aspects and utilities of the present general inventive concept may also be achieved by providing an image forming apparatus to perform various image forming operations, the image forming apparatus including a casing, an image forming unit to form an electrostatic latent image on a printing medium, a developing unit to apply toner to the printing medium to correspond to the electrostatic latent image, a fixing unit to fix the toner onto the printing medium, and an input unit coupled to the casing to input specific commands corresponding to the various image forming operations of the image forming apparatus, the input unit including a touch pad, including, a cover comprising a plurality of icons, and a circuit board to connect to the cover, the circuit board including a plurality of touch sensors corresponding to the plurality of icons, and a plurality of luminous elements to illuminate the icons.

The image forming apparatus may further including scanner to scan and save an image from a printing medium to a storage unit, and a photo-copying unit to photo-copy an image onto a printing medium.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
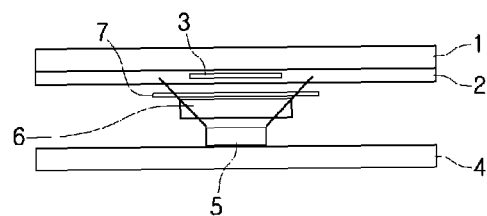
FIG. 1 is an exemplary view schematically illustrating a conventional touch pad.
Figure 2:
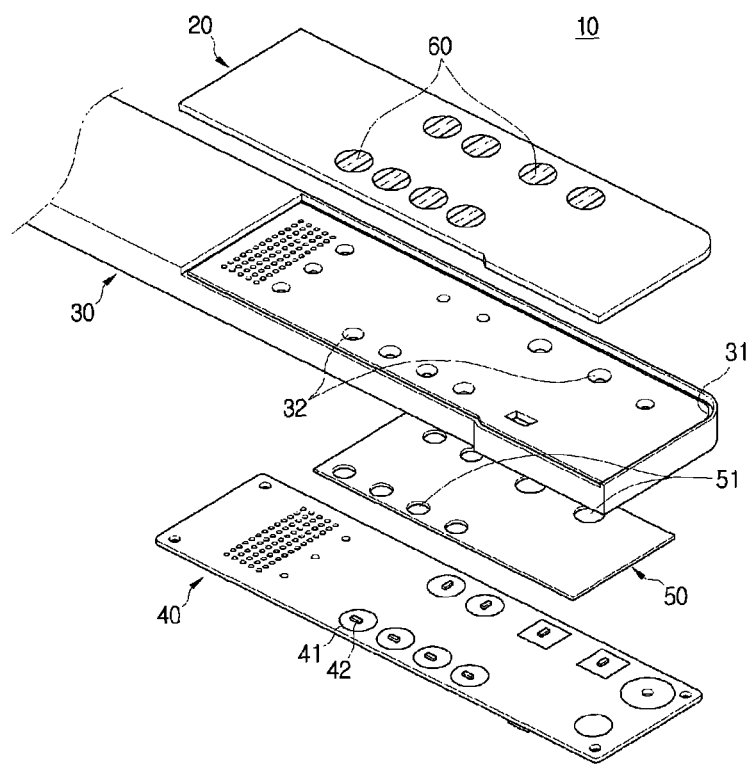
FIG. 2 is an exploded perspective view schematically illustrating a touch pad according to an exemplary embodiment of the present general inventive concept.
Figure 3:
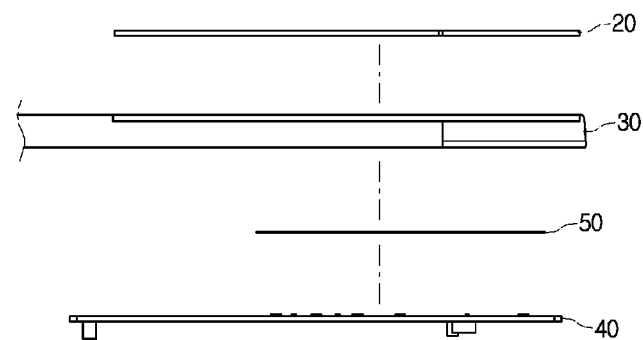
FIG. 3 is a view illustrating a relationship between components of the touch pad illustrated in FIG. 2.
Figure 4:
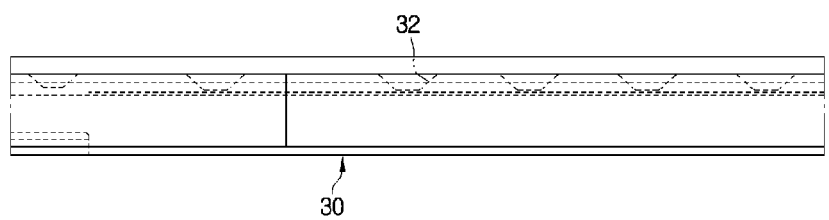
FIG. 4 is a detailed view illustrating a cover frame of the touch pad illustrated in FIG. 2.

Reference will now be made in detail to the embodiments of the present general inventive concept, examples of which are illustrated in the accompanying drawings, wherein like reference numerals refer to the like elements throughout.

The embodiments are described below in order to explain the present general inventive concept by referring to the figures.

As illustrated in FIGS. 2 through 5, a touch pad 10 according to an exemplary embodiment of the present general inventive concept includes a cover 20, a cover frame 30, a board 40, and a double-sided adhesive tape 50.

Figure 5:
FIG. 5 is a detailed view illustrating a cover of the touch pad illustrated in FIG. 2.

The cover 20 may be formed of a transparent polycarbonate sheet or an acryl sheet, though it is not limited to such materials, and the cover 20 may be formed using a transparent polycarbonate sheet. Referring to FIG. 5, the cover 20 includes a transparent polycarbonate sheet 21, a function icon film 22 which is printed on a rear surface of the polycarbonate sheet 21 and includes a plurality of function icons 60, and a diffusion silk film 23 which is printed on the function icon film 22. The diffusion silk film 23 may be used to diffuse light from a luminous element 42 to illuminate the plurality of function icons 60. The plurality of function icons 60 may include icons to perform particular functions or icons to switch modes of an apparatus.

The cover frame 30 may support the cover 20. Specifically, the cover 20 may be attached to a groove 31 using adhesives, etc., and may be supported by the groove 31, which is formed in a certain portion of an upper surface of the cover frame 30. In the cover frame 30, several hollows 32 may be disposed in positions corresponding to the function icons 60 on the cover 20. The hollows 32 may have a funnel shape in which a diameter thereof increases from a bottom portion to a top portion thereof. The hollows 32 may also be used to diffuse light a luminous element 42 to illuminate the plurality of function icons 60.

The conventional touch pad of FIG. 1 includes separate members, such as an LED holder and a diffusion sheet, in order to diffuse light to provide illumination from a luminous element. However, in the touch pad 10 according to an exemplary embodiment of the present general inventive concept, the cover 20 and cover frame 30 are integrally formed with each other, and thus a thickness of the touch pad 10 and a number of components can be reduced.

The board 40 is engaged with a lower surface of the cover frame 30, and includes a plurality of touch sensors 41 and the plurality of luminous elements 42 mounted thereon. The plurality of touch sensors 41 and the plurality of luminous elements 42 are mounted at positions corresponding to the plurality of function icons 60 on the cover 20. The touch sensors 41 may be formed using a capacitance detection technique, or may alternatively be formed using other techniques, such as a pressure detection technique.

The capacitance detection technique may involve a matrix of first and second conductive lines disposed perpendicularly to one another on the printed circuit board 40, and which are insulated from each other using an insulating layer. The insulating layer may be thin enough to promote significant capacitive coupling between a user's finger (i.e., conductive element, pen, stylus, object of high dielectric constant, etc.) placed on a surface thereof and the matrix of first and second conductive lines. Sensing electronics can sense a proximity or contact of the user's finger and can translate capacitance changes of the first and second conductive lines into digital information, which is processed to derive position and touch pressure information.

The pressure sensing technique may involve the hollows 32 each including a deformable material such as a polymeric foam to detect a pressure applied to the deformable material. Light from the one of the plurality of luminous elements 42 may be beamed into the deformable material to form an optical cavity with the deformable material, thereby forming a region of fully scattered light from the luminous element 42. A light intensity detector within or adjacent to the optical cavity and spaced apart from the luminous element 42 can detect intensity of the scattered and diffused light within the deformable material. The light intensity detector may operate on a principle whereby deformation of the deformable material decreases an effective size of the optical cavity, and thereby increases the light intensity in the region around the luminous element 42. Thus, when the luminous element 42 and the light intensity detector are adjacent to each other, they may both reside within the same optical cavity, boundaries of which are established by the illuminated zone created by the luminous element 32. Light within the optical cavity is fully integrated (i.e., scattered) by evenly disbursed scattering centers within the light intensity detector body. That is, light received at any single point within the optical cavity emanates evenly from all directions. An increase in pressure on the deformable material and consequent deformation in a region of the luminous element 32 results in a consequent increase in an intensity of light within the optical cavity, which is detected by the light intensity detector. A signal corresponding to the intensity detected by the detector can then be transmitted to a processing unit which accordingly quantifies a pressure experienced by the deformable material.

Although LEDs are commonly used as luminous elements 42 to make the function icons 60 visible to a user, the present general inventive concept is not limited to such a construction. Any elements that generate light to perform illumination may be applied to the present general inventive concept. Accordingly, the present general inventive concept discloses that when components are mounted on a single board, the touch pad according to the exemplary embodiment of the present general inventive concept may be thinner and structurally simpler than a conventional touch pad including two boards. Examples of the board 40 may include a printed circuit board (PCB) or a flexible printed circuit (FPC).

A double-sided adhesive tape 50 enables the cover frame 30 to be securely connected to the board 40. This secure connection between the cover-frame 30 and the board 40 removes any gaps between the cover-frame 30 and the board 40, thereby also removing any existing pockets of air disposed between the cover-frame 30 and the board 40. Accordingly, if the double-sided adhesive tape 50 is used, a user will not experience an unappealing texture when operating the touch pad 10, due to a lack of air between the cover frame 30 and the board 40.

In an exemplary embodiment of the present general inventive concept, double-sided adhesive tape 50 may be transparent or barely visible. Accordingly, a plurality of holes 51 may be formed at positions on the double-sided adhesive tape 50 corresponding to the respective function icons 60, so that light emitted from the luminous elements 42 can be projected through the cover 20. When using a transparent double-sided adhesive tape 50, although not illustrated, it is not necessary to form the above-described holes to project light. The cover frame 30 may be securely fixed to the board 40 using other adhesives or screws, instead of the double-sided adhesive tape 50, in order to maintain tight contact between the cover frame 30 and the board 40 without a gap of air disposed therebetween.

Operation of the touch pad 10 as constructed above is similar to the operation of the conventional touch pad of FIG. 1. In other words, the plurality of function icons 60 on the cover 20 can be made visible to a user using light projected from the luminous elements 42, and the user can touch a function icon 60 indicating a desired function to thereby operate the touch pad 10.

Figure 6:
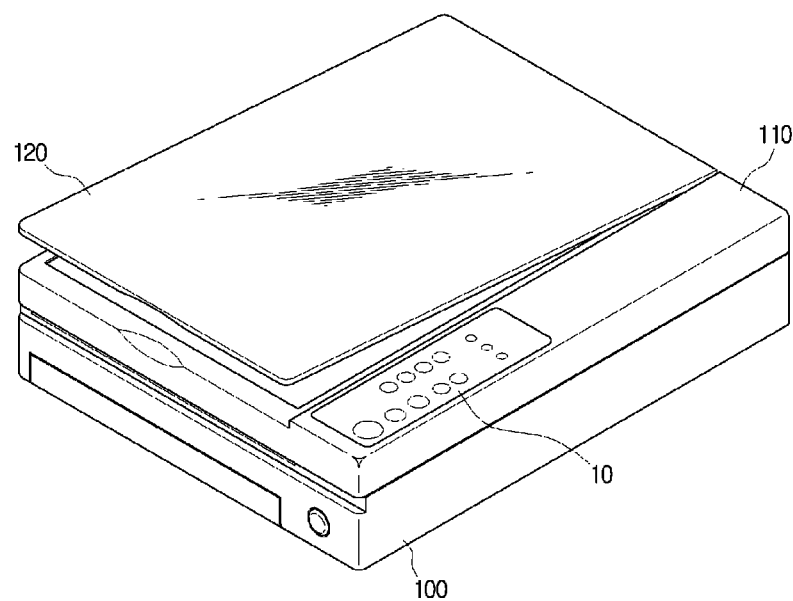
FIG. 6 is a view schematically illustrating an image forming apparatus including a touch pad according to an exemplary embodiment of the present general inventive concept.
Figure 7:
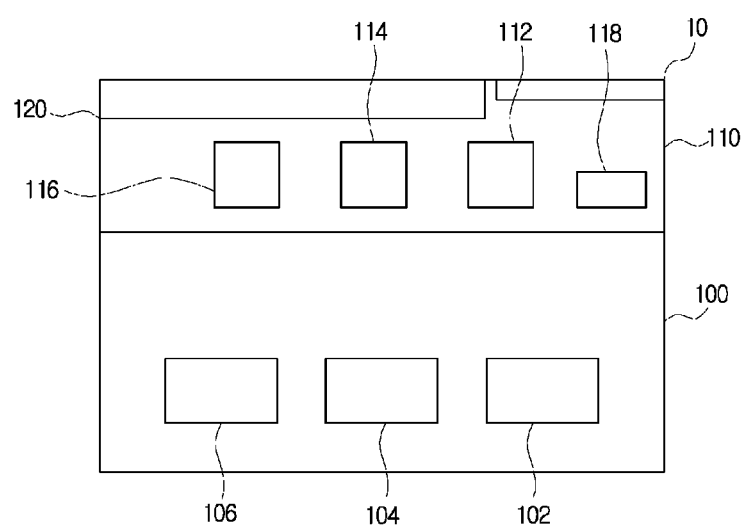
FIG. 7 is a block diagram illustrating the image forming apparatus of FIG. 6.

FIG. 6 schematically illustrates an image forming apparatus including the above-described touch pad 10, and FIG. 7 is a block diagram illustrating the image forming apparatus of FIG. 6. In FIG. 6, an image forming apparatus according to an exemplary embodiment of the present general inventive concept includes a first body 100, a second body 110, and a cover unit 120.

As illustrated in FIGS. 6 and 7, first body 100, although not illustrated in detail, includes a feeding unit 102, a developing unit 104, and a fixing unit 103. The second body 110 is pivotably mounted, and is capable of being opened and closed about the first body 100. The second body 110 includes an exposure unit 112 and a scanning unit 114. The cover unit 120 is pivotably mounted, capable of being opened and closed about the second body 110 in order to cover the scanning unit. The image forming apparatus of FIGS. 6 and 7 is not limited to the above description and configuration. For example, the second body may also include a photo-copying unit 116 to photo-copy an image onto a printing medium. The image forming apparatus may also include a scanner to scan an image from a printing medium to a storage unit 118. Furthermore, the first body 100 and the second body 110 may be fixed to each other to form a single casing.

The touch pad 10 according to an exemplary embodiment of the present general inventive concept may be placed on one side of an upper surface of the second body 110. If the second body 110 is thick, the touch pad 10 may be placed on a side surface or an entire surface of the second body 110. The construction and operation of the touch pad 10 are described above, so a detailed description thereof is omitted. The touch pad 10 according to an exemplary embodiment of the present general inventive concept, has a thin design as described above, and thus the touch pad may be employed in a slim image forming apparatus in order to improve an external design of the image forming apparatus.

Although the electronic device described above is an image forming apparatus, the present general inventive concept is not limited to such a device. The touch pad, according to an exemplary embodiment of the present general inventive concept is applicable to various information input devices, for example, portable terminals, laptops, digital tablets, etc., and is designed to make such a device slimmer.

As described above, an embodiment the present general inventive concept provides a thin and inexpensive touch pad having a simple structure by mounting components on a single board and removing various unimportant components. When the touch pad is employed in an electronic device such as an image forming apparatus, it is possible to improve the external design of the elective device, achieve slimness, and reduce manufacturing costs.

The electronic device according to an embodiment of the present general inventive concept can thereby sufficiently satisfy consumer preferences.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An image forming apparatus, comprising:
   an image forming unit to form an image onto a printing medium;
   a scanning unit to scan an image; and
   an input unit comprising:
      a plurality of function buttons, each configured to be illuminated and to be used to receive a user input,
      a board,
      at least one luminous element mounted on a side, that faces toward the plurality of function buttons, of the board to illuminate the plurality of function buttons,
      a plurality of touch sensors mounted on a the side, that faces toward the plurality of function buttons, of the board to correspond to the plurality of function buttons, and
      a frame comprising a plurality of openings corresponding to the plurality of function buttons,
      wherein the plurality of touch sensors are disposed at positions corresponding to the plurality of openings, respectively.

2. The image forming apparatus of claim 1, further comprising:
   a cover in which the plurality of function buttons is disposed, wherein the frame is disposed between the board and the cover.

3. The image forming apparatus of claim 2, wherein the plurality of openings separate the plurality of touch sensors from each other, and
   the cover is disposed at a top surface of the frame and the board is disposed at a bottom surface of the frame.

4. The image forming apparatus of claim 3, further comprising:
   a double-sided adhesive tape to form a secure connection between the frame and the board and to prevent air from entering between the frame and the board.

5. The image forming apparatus of claim 1, wherein the plurality of function buttons are not visible to a user of the image forming apparatus until the at least one luminous element illuminates the plurality of function buttons.

6. The image forming apparatus of claim 2, wherein the cover further comprises a transparent polycarbonate sheet or an acryl sheet.

7. The image forming apparatus of claim 2, wherein the cover comprises:
   a transparent polycarbonate sheet;
   a function button film printed on a rear surface of the polycarbonate sheet; and
   a diffusion silk film printed on the function button film to diffuse light emitted from the at least one luminous element.

8. The image forming apparatus of claim 1, wherein each luminous element of the at least one luminous element comprises a light emitting diode (LED).

9. The image forming apparatus of claim 1, further comprising:
   a cover having the plurality of function buttons.

10. The image forming apparatus of claim 1 wherein the frame is engaged with the board.

11. The image forming apparatus of claim 1 wherein the openings have a funnel shape.

12. The image forming apparatus of claim 1, wherein each of the openings comprises a deformable material.

13. The image forming apparatus of claim 1, wherein the plurality of function buttons are configured as a plurality of icons.

14. The image forming apparatus of claim 1, further comprising:
   a cover unit to cover the scanning unit.

15. An image forming apparatus, comprising:
   an image forming unit to form an image onto a printing medium;
   a scanning unit to scan an image;
   a cover having a plurality of function icons, each configured to be illuminated and to receive a user input;
   a board;
   at least one luminous element mounted on a side, that faces toward the plurality of function icons, of the board to illuminate the plurality of function icons;
   a plurality of touch sensors mounted on the side, that faces toward the plurality of function icons, of the board to correspond to the plurality of function icons; and
   a frame disposed between the board and the cover, and comprising a plurality of openings corresponding to the plurality of function icons,
   wherein the plurality of touch sensors are disposed at positions corresponding to the plurality of openings, respectively.

16. The image forming apparatus of claim 15, further comprising:
   a cover unit to cover the scanning unit.

17. An image forming apparatus, comprising:
   an image forming unit to form an image onto a printing medium;
   a scanning unit to scan an image;
   a plurality of function buttons, each configured to be illuminated and to receive a user input;
   a board;
   at least one luminous element mounted on a side, that faces toward the plurality of function buttons, of the board to illuminate the plurality of function buttons;
   a plurality of touch sensors mounted on the side, that faces toward the plurality of function buttons, of the board to correspond to the plurality of function buttons; and
   a frame disposed between the board and the plurality of function buttons, and comprising a plurality of openings corresponding to the plurality of function buttons,
   wherein the plurality of touch sensors, the plurality of openings, and the plurality of functions buttons are aligned, respectively, with each other.

18. The image forming apparatus of claim 17, further comprising:
   a cover in which the plurality of function buttons is disposed, wherein the frame is disposed between the board and the cover.

19. The image forming apparatus of claim 18, wherein
   the plurality of openings separate the plurality of touch sensors from each other, and
   the cover is disposed at a top surface of the frame and the board is disposed at a bottom surface of the frame.

20. The image forming apparatus of claim 19, further comprising:
   a double-sided adhesive tape to form a secure connection between the frame and the board and to prevent air from entering between the frame and the board.

21. The image forming apparatus of claim 17, wherein the plurality of function buttons are not visible to a user of the image forming apparatus until the at least one luminous element illuminates the plurality of function buttons.

22. The image forming apparatus of claim 18, wherein the cover further comprises a transparent polycarbonate sheet or an acryl sheet.

23. The image forming apparatus of claim 18, wherein the cover comprises:
   a transparent polycarbonate sheet;
   a function button film printed on a rear surface of the polycarbonate sheet; and
   a diffusion silk film printed on the function button film to diffuse light emitted from the at least one luminous element.

24. The image forming apparatus of claim 17, wherein the frame is engaged with the board.

25. The image forming apparatus of claim 17, wherein the plurality of function buttons are configured as a plurality of icons.

26. An image forming apparatus, comprising:
   an image forming unit to form an image onto a printing medium;
   a scanning unit to scan an image; and
   an input unit comprising:
      a plurality of function buttons, each configured to be illuminated and to be used to receive a user input,
      a board,
      at least one luminous element mounted on a side, that faces toward the plurality of function buttons, of the board to illuminate the plurality of function buttons,
      a plurality of touch sensors mounted on the side, that faces toward the plurality of function buttons, of the board to correspond to the plurality of function buttons, and
      a structure comprising a plurality of openings corresponding to the plurality of function buttons,
   wherein the plurality of touch sensors are disposed at positions corresponding to the plurality of openings, respectively.

* * * * *

UNITED STATES PATENT AND TRADEMARK OFFICE
CERTIFICATE OF CORRECTION

| | | |
|---|---|---|
| PATENT NO. | : 9,557,838 B2 | Page 1 of 1 |
| APPLICATION NO. | : 14/263270 | |
| DATED | : January 31, 2017 | |
| INVENTOR(S) | : Yoon et al. | |

It is certified that error appears in the above-identified patent and that said Letters Patent is hereby corrected as shown below:

In the Claims
Column 7, Line 13, Claim 1:
Delete "on a the" and insert -- on the --, therefor.

Signed and Sealed this
Eighteenth Day of April, 2017

Michelle K. Lee
*Director of the United States Patent and Trademark Office*